United States Patent
Emoto et al.

(10) Patent No.: US 10,266,768 B2
(45) Date of Patent: Apr. 23, 2019

(54) β-SIALON PHOSPHOR CONTAINING EUROPIUM ELEMENT AND METHOD FOR PRODUCING THE SAME, AND LIGHT-EMITTING MEMBER AND LIGHT EMITTING DEVICE

(71) Applicant: DENKA COMPANY LIMITED, Tokyo (JP)

(72) Inventors: Hideyuki Emoto, Fukuoka (JP); Toshiaki Nagumo, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 15/639,534

(22) Filed: Jun. 30, 2017

(65) Prior Publication Data
US 2018/0002601 A1 Jan. 4, 2018

(30) Foreign Application Priority Data
Jul. 1, 2016 (JP) .................................. 2016-131267

(51) Int. Cl.
*H01L 33/00* (2010.01)
*C09K 11/77* (2006.01)
*C09K 11/08* (2006.01)
*H01L 33/50* (2010.01)

(52) U.S. Cl.
CPC ...... *C09K 11/7734* (2013.01); *C09K 11/0883* (2013.01); *H01L 33/502* (2013.01)

(58) Field of Classification Search
CPC ............ C09K 11/7734; C09K 11/0883; H01L 33/502
See application file for complete search history.

(56) References Cited

U.S. PATENT DOCUMENTS

| 8,080,174 B2 * | 12/2011 | Kawasaki | C09K 11/0883 |
| | | | 252/301.4 F |
| 8,487,393 B2 | 7/2013 | Emoto et al. | |
| 9,391,245 B2 * | 7/2016 | Won | C09K 11/0883 |
| 2005/0253095 A1 * | 11/2005 | Chen | C09K 11/574 |
| | | | 250/581 |

(Continued)

FOREIGN PATENT DOCUMENTS

JP 5368557 B2 9/2013

OTHER PUBLICATIONS

Rosengern et al., Feb. 1975, Alloy theory of the intermediate valence state_ Application to europium metal, Physical Review B, vol. 13, No. 4 (Year: 1975).*

(Continued)

Primary Examiner — Ismail A Muse
(74) Attorney, Agent, or Firm — Caesar Rivise, PC

(57) ABSTRACT

Provided is a β-sialon phosphor having a β-sialon as a host crystal and containing Eu as a luminescent center, wherein when chemical states of Eu are classified into three states: $Eu^{2+}$, $Eu^{3+}$ and an intermediate state thereof (hereinafter, referred to as $Eu_m$), a ratio of them present in the β-sialon phosphor satisfies the relationships: $0.1 < Eu_m/(Eu^{2+}+Eu^{3+}+Eu_m) < 0.4$ and $Eu^{2+}/(Eu^{2+}+Eu^{3+}) > 0.7$.

6 Claims, 1 Drawing Sheet

(56) References Cited

U.S. PATENT DOCUMENTS

| | | | |
|---|---|---|---|
| 2010/0053932 A1* | 3/2010 | Emoto | C04B 35/597 |
| | | | 362/84 |
| 2010/0219741 A1* | 9/2010 | Kawasaki | C09K 11/0883 |
| | | | 313/483 |
| 2011/0198656 A1* | 8/2011 | Emoto | C09K 11/0883 |
| | | | 257/98 |
| 2014/0008680 A1* | 1/2014 | Won | C09K 11/0883 |
| | | | 257/98 |

OTHER PUBLICATIONS

Nowik et al., Feb. 1986, Intermediate Valence of Europium in EuxLa1-xBe13, Hyperfine Interactions (Year: 1986).*

Franz et al., Jul. 1970, Intermediate Valence on Dilute Europium Ions, The American Physical Society, vol. 45, No. 1 (Year: 1970).*

Menushenkov et al., Feb. 2015, The Influence of Hydrostatic Pressure on Intermediate Europium Valence State in Compound EuCu2Ge2, Elsevier (Year: 2015).*

* cited by examiner

[FIG. 1]
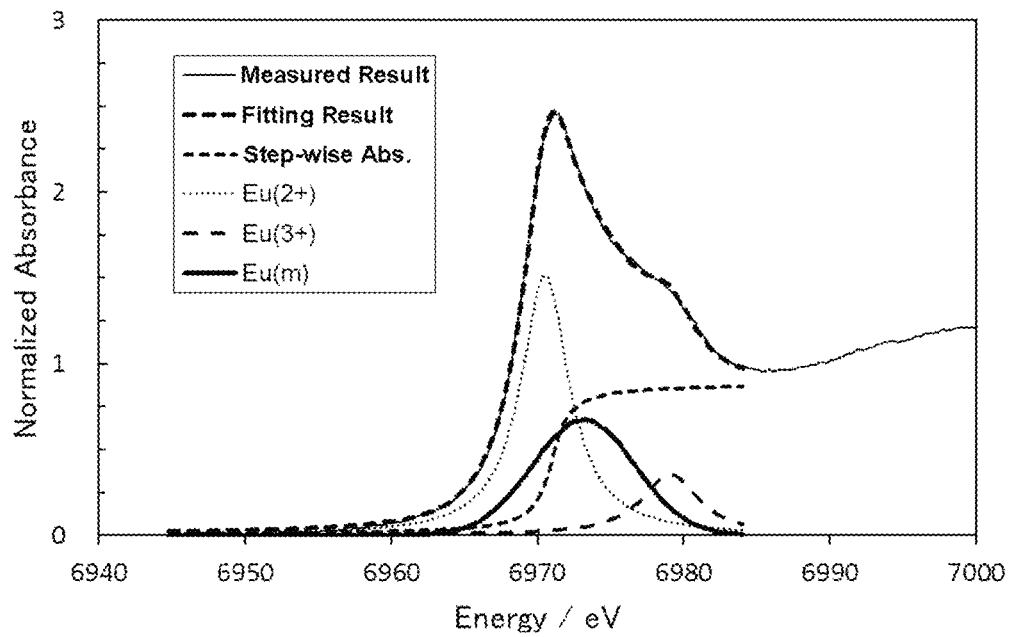
[FIG. 2]
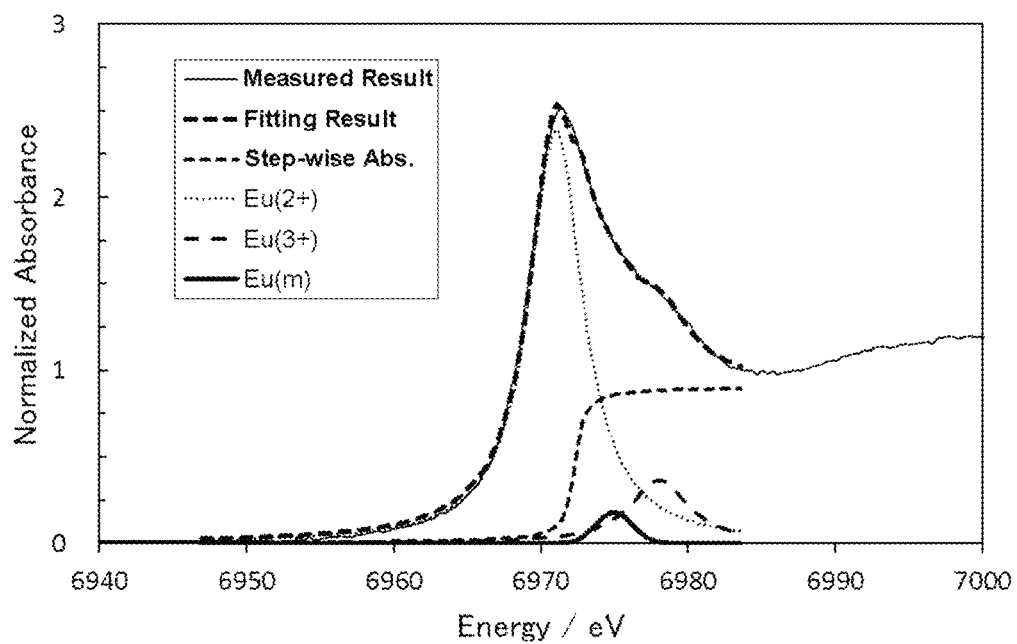

β-SIALON PHOSPHOR CONTAINING EUROPIUM ELEMENT AND METHOD FOR PRODUCING THE SAME, AND LIGHT-EMITTING MEMBER AND LIGHT EMITTING DEVICE

CROSS-REFERENCE TO RELATED APPLICATIONS

This application claims priority from JP 2016-131267, filed Jul. 1, 2016, the contents of which application are incorporated herein by reference in their entireties for all purposes.

TECHNICAL FIELD

The present invention relates to a β-sialon phosphor that is efficiently excited by ultraviolet to blue light and emits green light, and a method for producing the same, as well as a light emitting member and a light emitting device using the β-sialon phosphor.

BACKGROUND ART

Eu ions are present in divalent and trivalent states, which respectively act as activators for phosphors. In particular, the divalent $Eu^{2+}$ provides efficient phosphors because the divalent $Eu^{2+}$ can efficiently absorb excitation energy by an absorption band of 4f-5d acceptable transition and can emit light. Phosphors having a host material of orthosilicate; α- and β-sialons; $M_2Si_5N_8$ or $MAlSiN_3$ in which M is an alkaline earth element; or like, activated with $Eu^{2+}$, are efficiently excited by blue light, and provide fluorescence emission of green to red color with high efficiency, so that the phosphors are widely used as phosphors for white light emitting diodes (white LEDs).

For the Eu present in the phosphor, $Eu^{3+}$ often coexists in addition to $Eu^{2+}$ of interest. Therefore, to obtain high fluorescence properties, it is desirable to increase the ratio of $Eu^{2+}$ present in the phosphor. The ratio of $Eu^{2+}$ and $Eu^{3+}$ can be quantified, such as by measuring a XANES spectrum of a Eu-L3 absorption edge. The XANES is an abbreviation of X-ray Absorption Near Edge Structure and is one spectroscopic method of X-ray absorption fine structure (XAFS) measurement methods. Strong absorption peak energy appearing in an L3 absorption edge XANES spectrum of a rare earth element is known to be determined by the valence of the rare earth element. In the case of Eu, peaks of $Eu^{2+}$ and $Eu^{3+}$ appear near 6970 eV and near 6980 eV, respectively, so that quantification can be performed by separating these two peaks.

For a phosphor that might contain Eu having various valences, the ratio of $Eu^{2+}$ and $Eu^{3+}$ has been calculated by the XAFS measurement method and the correlation between the fluorescence properties and the $Eu^{2+}/Eu^{3+}$ ratio has been discussed. For example, a β-sialon phosphor activated with Eu has been shown to have $Eu^{2+}/(Eu^{2+}+Eu^{3+})$ of 0.8 or more, and increased luminance (Patent Document 1).

The β-sialon phosphor activated with Eu has not only improved heat resistance and durability, and less change in luminance due to temperature rising, but also is excited with light having a wide wavelength from ultraviolet to blue light and emits green light having a peak in a wavelength range of 520 to 550 nm. Therefore, for the β-sialon phosphor activated with Eu, practical use has proceeded as a phosphor useful for the white LEDs. As stated above, the increased ratio $Eu^{2+}/(Eu^{2+}+Eu^{3+})$ improves the luminance of the β-sialon phosphor, but there is a strong need for further higher luminance. However, there has been a situation where it has been difficult to further increase the luminance of the β-sialon phosphor by simply increasing the $Eu^{2+}/(Eu^{2+}+Eu^{3+})$.

PRIOR ART DOCUMENT

[Patent Document 1] Japanese Patent No. 5368557 B1

SUMMARY OF THE INVENTION

Problem to be Solved by the Invention

The present invention has been made to solve the above problems. An object of the present invention is to provide a β-sialon phosphor having high luminance and a method for producing the same, as well as a light emitting member and a light emitting device using the β-sialon phosphor having such a property.

Means for Solving the Problem

The present inventors have made intensive studies for the β-sialon phosphor by focusing on the state of Eu present, and as a result, have found that the Eu present in the phosphor has an intermediate chemical state other than $Eu^{2+}$ and $Eu^{3+}$, and when the Eu in this intermediate state is present within a certain range, the luminance of the phosphor is increased. The present invention has been completed on the basis of the findings.

Thus, the present invention relates to a β-sialon phosphor having a β-sialon as a host crystal and containing Eu as a luminescent center, wherein when chemical states of Eu are classified into three states: $Eu^{2+}$, $Eu^{3+}$ and an intermediate state thereof (hereinafter, referred to as $Eu_m$), a ratio of them present in the β-sialon phosphor satisfies the relationships: $0.1<Eu_m/(Eu^{2+}+Eu^{3+}+Eu_m)<0.4$ and $Eu^{2+}/(Eu^{2+}+Eu^{3+})>0.7$.

Further, the present invention relates to a method for producing a β-sialon phosphor, comprising a first firing step of firing a mixed powder containing at least silicon nitride, aluminum nitride and an Eu compound in a nitrogen atmosphere at a temperature of 1550 to 2100° C. to provide a fired powder; a second firing step of adding to the fired powder one or more powders selected from silicon nitride, silicon oxide, aluminum nitride, aluminum oxide and europium oxide and firing the resulting powder mixture in a nitrogen atmosphere at a temperature of 1900 to 2100° C. to provide a fired product; an annealing step of heating the fired product in a non-oxidizing atmosphere other than pure nitrogen at a temperature less than or equal to the second firing temperature; and an acid-treating step of treating the annealed powder with an acid.

Further, the present invention relates to a light emitting member comprising a light emitting element; one or more β-sialon phosphors that absorb light emitted from the light emitting element and emit light having a longer wavelength than light emitted from the light emitting element; and a sealing material containing the β-sialon phosphor(s), wherein the β-sialon phosphor is the β-sialon phosphor of the present invention.

Furthermore, the present invention relates to a light-emitting device using the light emitting member of the present invention.

EFFECTS OF THE INVENTION

According to the present invention, it is possible to provide a β-sialon phosphor exhibiting high luminance and a method for producing the same, as well as a light emitting member and a light emitting device using the β-sialon phosphor having such a property.

BRIEF DESCRIPTION OF THE DRAWINGS

FIG. 1 is an explanatory view showing a XANES spectrum of a β-sialon phosphor obtained in Example 1.

FIG. 2 is an explanatory view showing a XANES spectrum of a β-sialon phosphor obtained in Comparative Example 1.

MODES FOR CARRYING OUT THE INVENTION

The β-sialon phosphor of the present invention relates to a β-sialon phosphor having a β-sialon as a host crystal and containing Eu as a luminescent center, wherein when chemical states of Eu are classified into three states: $Eu^{2+}$, $Eu^{3+}$ and an intermediate state thereof (hereinafter, referred to as $Eu_m$), a ratio of them present in the β-sialon phosphor satisfies the relationships: $0.1 < Eu_m/(Eu^{2+}+Eu^{3+}+Eu_m) < 0.4$ and $Eu^{2+}/Eu^{2+}+Eu^{3+}) > 0.7$.

Conventionally, Eu is present in two chemical states: $Eu^{2+}$ and $Eu^{3+}$, and the ratio of them is calculated by separating XANES spectra obtained by XAFS measurement into two peaks of $Eu^{2+}$ and $Eu^{3+}$. In the XANES spectra, absorption peaks of Eu appear at a predetermined energy position depending on its valences, and a difference in absorption peak energy of $Eu^{2+}$ and $Eu^{3+}$ should be constant. However, the present inventors have measured and analyzed the states of Eu in various β-sialon phosphors, and as a result, have found that the difference in the absorption peak energy has not been constant and has been different depending on the samples. This has showed that between the absorption peaks of $Eu^{2+}$ and $Eu^{3+}$, an intermediate state ($Eu_m$) is present between $Eu^{2+}$ and $Eu^{3+}$. Based on the fact that the peak of $Eu^{2+}$ appears in energy that is lower by about 8 eV than the peak of $Eu^{3+}$ in the XANES spectra, the ratio of $Eu^{2+}$, $Eu^{3+}$ and $Eu_m$ present between them can be calculated. The green emission of the β-sialon phosphor is involved by electronic transition of $Eu^{2+}$ dissolved in the β-sialon crystal, and $Eu_m$ does not directly contribute to the emission. The $Eu_m$ would be present in the crystal grain boundaries or grain boundaries. The $Eu_m$ is generated in the crystal growth process of the β-sialon, and an amount of $Eu_m$ present in the phosphor would be an index having high correlation with the crystallinity of the β-sialon. If $Eu_m/(Eu^{2+}+Eu^{3+}+Eu_m)$ is 0.1 or less, the phosphor will have lower luminance due to lower crystallinity of the β-sialon, and if $Eu_m/(Eu^{2+}+Eu^{3+}+Eu_m)$ is 0.4 or more, the ratio of any crystal other than the β-sialon crystal, which does not contribute to light emission in the phosphor, will be undesirably increased.

Further, in the conventional analysis method in which the peak energy difference between $Eu^{2+}$ and $Eu^{3+}$ is not constant, many of $Eu_m$ tend to be evaluated as the $Eu^{3+}$ component, and if the $Eu_m$ is present, the ratio of $Eu^{2+}$ tends to be underestimated. However, in a three component analysis in which the above $Eu_m$ is added, the exact ratio of $Eu^{2+}$ and $Eu^{3+}$ present in the phosphor becomes clarified. It is preferable that $Eu^{3+}$ that will not contribute to the light emission is decreased as much as possible in the β-sialon phosphor of the present invention, and more particularly, $Eu^{2+}/(Eu^{2+}+Eu^{3+})$ is higher than 0.7.

The β-sialon which is the host crystal of the β-sialon phosphor of the present invention is a solid solution in which the Si position is partially substituted with Al and the N position is partially substituted with O in the β-silicon nitride ($Si_3N_4$), and represented by the general formula: $Si_{6-z}Al_zO_zN_{8-z}$. The range of the compositional parameter z value capable of maintaining the crystal structure of the β-sialon is from 0 to 4.2. The z value will be affected by the coordination environment of the Eu ions that are dissolved in the β-sialon crystal, and will have a great effect on fluorescence properties. The z value desirable to obtain a green phosphor having high luminance is in the range of 0.005 to 1.

Further, the amount of Eu contained in the β-sialon phosphor of the present invention is preferably 0.1 to 2% by mass. If the Eu content is less than 0.1% by mass, then the number of Eu ions involved in the light emission as the β-sialon will be undesirably reduced and sufficient luminance cannot be obtained. If the Eu content is more than 2% by mass, then concentration quenching will be generated or a heterogenous phase such as α-sialon in which Eu not dissolved in the β-sialon crystal absorbs visible light will be formed, thereby leading to lower luminance, which is not preferable.

An example of the method for producing the β-sialon phosphor of the present invention will be described below. However, the method for producing the phosphor of the present invention is not limited to this method, and any of methods known in the art or a combination thereof may be used as long as the state of Eu present in the β-sialon phosphor may be within the scope of the present invention.

As a raw material, a mixed powder containing silicon nitride ($Si_3N_4$), aluminum nitride (AlN) and an Eu compound(s) can be used. The Eu compound can be selected from metals, oxides, carbonates, halides, nitrides and oxynitrides of Eu. These Eu compounds can be used alone or in combination of two or more. The predetermined raw materials can be blended such that firing can be carried out in two stages and the second firing can finally provide the final composition of the β-sialon phosphor. In this case, an amount of the oxide contained in the silicon nitride powder or the aluminum nitride powder should be also taken into consideration. For the purpose of adjusting the amount of oxygen derived from the raw materials, silicon oxide ($SiO_2$), aluminum oxide ($Al_2O_3$), metallic silicon or metallic aluminum may be mixed.

The above raw materials can be mixed, such as by dry-mixing them, wet-mixing them in an inert solvent that will not substantially react with each component of the raw materials and then removing the solvent, or the like. A mixing apparatus that can be suitably used includes a V-type mixer, a rocking mixer, a ball mill, a vibration mill and the like.

The mixed raw material powder as stated above is filled in a container such as a crucible in which at least a surface to be in contact with the raw material is made of boron nitride, and then heated at a temperature of 1550 to 2100° C. in a nitrogen atmosphere, thereby allowing the reaction in the raw material powder to proceed. The purpose of this stage is to highly disperse Eu in the sample by utilizing the reaction, and it does not matter whether the yield is high or low as long as the β-sialon is at least partially generated at this stage. As the temperature of the oxides contained in the raw materials is elevated to produce a liquid phase, the Eu is diffused in the liquid phase, so that the Eu will be highly dispersed. The firing temperature of lower than 1550° C. will produce no or too little liquid phase, thereby leading to insufficient diffusion of Eu, which is not preferable. The firing temperature of more than 2100° C. will require a very high nitrogen pressure in order to suppress decomposition of the β-sialon, which is industrially undesirable.

A sample (fired powder) obtained in the first firing step may be in the form of powder or in the form of an agglomerate depending on the raw material mixing composition and the firing temperature. Therefore, crushing and pulverization may be optionally carried out, for example to produce powder having a size enough to thoroughly pass through a sieve with an opening of 45 μm.

To the fired powder is then added one or more selected from silicon nitride, silicon oxide, aluminum nitride, aluminum oxide and europium oxide, mixed and filled in the container in the same manners as described above, and a second firing step is then carried out in a nitrogen atmosphere at a temperature of 1900 to 2100° C. to provide a fired product. The fired product is β-sialon with the Eu dissolved. In the second firing step, the firing temperature is preferably 1900° C. or higher to increase the yield of β-sialon. Since a sample (fired product) after the second firing is in the form of an agglomerate, the sample should be crushed and pulverized into powder.

The β-sialon (fired product) containing Eu synthesized by the above method is subjected to an annealing treatment by heating the β-sialon in a non-oxidizing atmosphere other than pure nitrogen at a temperature lower than or equal to the second firing temperature to increase the proportion of $Eu^{2+}$ in the Eu, while changing the state of Eu such that the Eu inhibiting fluorescence emission can be dissolved and removed by subsequent acid treatment step. A preferable atmosphere for carrying out the annealing treatment includes a rare gas or a reducing gas. The rare gas includes, for example, gases of Group 18 elements such as argon and helium. The reducing gas includes a gas having a reducing power, such as ammonia, carbon dioxide, carbon monoxide and hydrogen. The reducing gas may be used alone or in combination with a neutral gas such as nitrogen or the rare gas.

The proper range of the temperature of the annealing treatment varies depending on the atmosphere to be used. If the temperature is too low, the state change of Eu will not proceed and the properties will not improve, and if the temperature is too high, the β-sialon will be decomposed, both of which are not preferred. An appropriate temperature range of the annealing treatment in the rare gas atmosphere such as argon or helium may be 1350 to 1600° C.

The powder that underwent the annealing treatment (annealed powder) is then subjected to an acid treatment. Examples of acids that can be used in the acid treatment include one or more acids selected from hydrofluoric acid, sulfuric acid, phosphoric acid, hydrochloric acid and nitric acid, in the form of an aqueous solution containing these acids. The main purpose of this acid treatment is to remove any compound that will inhibit fluorescence emission generated during the annealing step, preferably using a mixed acid of hydrofluoric acid and nitric acid. The acid treatment step is carried out by dispersing the annealed β-sialon phosphor in the aqueous solution containing the acid as mentioned above and reacting the phosphor with the above acid for approximately a few minutes to a few hours (e.g., 10 minutes to 3 hours) with stirring. The temperature of the acid may be at room temperature, but since a higher temperature will tend to accelerate the reaction, the temperature is preferably 50 to 80° C. After the acid treatment, the phosphor particles are preferably separated from the acid through a filter or the like and then rinsed with water.

The β-sialon phosphor of the present invention is excited in a wide wavelength range from ultraviolet light to visible light, emits green light with high fluorescence luminous efficiency, and is excellent as a green phosphor. The β-sialon phosphor has little luminance change even if the environment to be used is changed, and can be used alone or in combination with other phosphors for various light emitting elements, in particular white light LEDs using ultraviolet LED or blue LED as a light source.

The light emitting member of the present invention comprises a light emitting element; one or more β-sialon phosphors absorbing light emitted from the light emitting element and emitting light having a longer wavelength than light emitted from the light emitting element; and a sealing material containing the β-sialon phosphor(s), wherein the β-sialon phosphor is the above-mentioned β-sialon phosphor. The light emitting member according to the present invention can exhibit a decrease in luminance reduction even if it is used at an elevated temperature, and have a long service life and high luminance, because the light emitting member employs the above-mentioned β-sialon phosphor.

Further, the present invention is a light emitting device using the light emitting member. Because of the light emitting device using the β-sialon phosphor as described above, the device can exhibit small decreases in luminance and color shift, and have further long service life.

EXAMPLE

Hereinafter, the present invention will be described in more detail with reference to Examples and Comparative examples, but the present invention is not intended to be limited thereto.

Example 1

95.43% by mass of α-silicon nitride powder (SN-E 10 grade, oxygen content of 1.0% by mass) available from Ube Industries, Ltd., 3.04% by mass of aluminum nitride powder (F grade, oxygen content of 0.8% by mass) available from Tokuyama Corporation, 0.74% by mass of aluminum oxide powder (TM-DAR grade) available from TAIMEI CHEMICALS CO., LTD., and 0.79% by mass of europium oxide powder (RU grade) available from Shin-Etsu Chemical Co., Ltd. were mixed using a V-type mixer (S-3 available from TSUTSUI SCIENTIFIC INSTRUMENTS CO., LTD.), and thoroughly passed through a sieve having an opening of 250 μm to remove agglomerates to obtain mixed raw material powder. The mixing ratio herein (First Mixing Composition (% by mass)) was designed such that in the general formula of β-sialon: $Si_{6-z}Al_zO_zN_{8-z}$, the parameter z was 0.25 as calculated from the Si/Al ratio with the exception of europium oxide.

200 g of the mixed raw material powder having the first mixing composition thus obtained was filled in a cylindrical boron nitride container with a lid having an inner diameter of 10 cm and a height of 10 cm (N-1 grade, available from Denka Company Limited.), and a heating step (the first firing step) was carried out in an electric furnace with a carbon heater in a pressurized nitrogen atmosphere of 0.8 MPa at 1800° C. for 4 hours. The powder subjected to the heat treatment was passed through a sieve having an opening of 45 μm. In addition, the powder was thoroughly passed through the sieve. The powder subjected to the first firing step and passed through the sieve (referred to as fired powder) and the mixed raw material powder having the above first mixing composition were mixed in a mixing ratio of 1:1 by mass (Second Mixing Composition (% by mass)) by the same method as described above. 200 g of the resulting mixed powder was filled in a cylindrical boron nitride container with a lid having an inner diameter of 10 cm and a height of 10 cm, and a heat treatment (the second firing step) was carried out in an electric furnace with a carbon heater in a pressurized nitrogen atmosphere of 8 MPa at 2000° C. for 12 hours. Since the sample after the heat treatment was loosely agglomerated, the agglomerates were crushed by a hammer and then pulverized by a supersonic jet pulverizer (PJM-80SP available from NIPPON PNEUMATIC MFG. CO., LTD.). The pulverization conditions were a feed rate of the sample of 50 g/min and a pulverizing air pressure of 0.3 MPa. This pulverized powder was completely passed through a sieve having an opening of 45 μm. In addition, the passing rate of the sieve was 95%.

20 g of the pulverized powder that carried out the second firing step and passed through the sieve with the opening of 45 μm was filled in a cylindrical boron nitride container with a lid of an inner diameter of 5 cm and a height of 3.5 cm, and an annealing treatment was carried out in an electric furnace with a carbon heater at 1500° C. for 8 hours in an argon atmosphere at atmospheric pressure. The annealed powder was subjected to an acid treatment by immersing the powder in a mixed acid of 50% hydrofluoric acid and 70% nitric acid in a ratio of 1:1 at 75° C. for 30 minutes. The powder after the acid treatment was precipitated as it was, and decantation for removing the supernatant and fine powder was repeated until the pH of the solution was 5 or more and the supernatant became transparent. The precipitate finally obtained was filtered and dried to obtain β-sialon phosphor powder of Example 1. Powder X-ray diffraction measurement showed that the crystal phase present was a β-sialon single phase. An ICP emission spectroscopic analysis showed that the measured Si, Al and Eu contents were 57.7, 2.29, and 0.62% by mass, respectively. The z value calculated from the Si and Al contents was 0.24. The first and second mixing compositions of Example 1 are shown in Table 1.

Comparative Example 1

200 g of mixed first raw material powder blended in the same composition as that of Example 1 was filled in a cylindrical boron nitride container with a lid having an inner diameter of 10 cm and a height of 10 cm (N-1 grade, available from Denka Company Limited.), as in the first firing step, with the exception that a heat treatment corresponding to the first firing step of Example 1 was not carried out and a heat treatment was carried out under the same conditions as those of the second firing step of Example 1. The sample obtained by the heat treatment was pulverized, annealed and acid-treated according to the same method and conditions as in Example 1 to obtain β-sialon phosphor powder of Comparative Example 1. Powder X-ray diffraction measurement showed that the crystal phase present was a β-sialon single phase. An ICP emission spectroscopic analysis showed that the measured Si, Al and Eu contents were 57.3, 2.23 and 0.56% by mass, respectively. The z value calculated from the Si and Al contents was 0.23. The mixing composition of the mixed raw material powder of Comparative Example 1 is shown in the column of the second mixing composition of Table 1.

(Evaluation of Fluorescence Properties)

For the fluorescence properties of each β-sialon phosphor, peak intensity and a peak wavelength were determined by measuring a fluorescence spectrum of the phosphor powder that filled in a dedicated solid sample holder and irradiated with excitation light diffracted at a wavelength of 455 nm by a fluorescence spectrophotometer (F-7000, available from Hitachi High-Technologies Corporation) calibrated with a Rhodamine B method and a standard light source. Since the peak intensity varies depending on the measuring apparatus and conditions, the unit is an arbitrary unit. The peak intensities of the β-sialon phosphors of Example 1 and Comparative Example 1 were continuously measured under the same condition and compared with each other. When the peak intensity of the β-sialon phosphor of Comparative Example 1 was defined as 100%, the peak intensity of the phosphor of Example 1 was 112%. The peak wavelength was 542 nm for both Example 1 and Comparative Example 1.

(XAFS measurement)

The XAFS spectrum of the Eu-L3 absorption edge of the β-sialon phosphor was measured by a XAFS measurement apparatus installed at a beamline BL 11 or BL 15 in the Saga Prefectural Kyushu Synchrotron Light Research Center (SAGA-LS) using an Si(111)2 crystal spectrometer. For energy calibration of X-ray, the XANES measurement for the Eu-L3 absorption edge of europium oxide was carried out before measuring the sample, and its absorption peak energy was 6980 eV. The sample to be measured was prepared by mixing about 50 mg of the phosphor powder with about 120 mg of boron nitride as a diluent in an agate mortar to provide an uniform mixture, and die-molding the mixture into a pellet having a diameter of 10 mm and a thickness of 1 mm, which was then used as the sample to be measured. The incident X-ray energy was measured by scanning a range of 6800 to 7100 eV, and more particularly scanning the vicinity of the Eu-L3 absorption edge (6980 eV) at an interval of about 0.4 eV. The incident X-ray intensity I0 and the transmitted X-ray intensity were measured by a transmission method using an ionization chamber with an electrode length of 17 cm, which passed through a mixed gas of He and $N_2$ at 50:50, and an ionization chamber with an electrode length of 31 cm, which passed through a $N_2$ gas, respectively.

The resulting XANES spectrum of the Eu-L3 absorption edge was normalized such that a background on the lower energy side (pre-edge area) than the absorption peak was subtracted and background intensity on the higher energy side (post-edge area) than the absorption peak was 1. A portion corresponding to step-wise absorption of the normalized spectrum was modeled by an arc tangent function, peaks corresponding to $Eu^{2+}$ and $Eu^{3+}$ was modeled by a Lorentz function, and a peak corresponding to $Eu_m$ was modeled by a Gaussian function. The initial value at the peak position of each component was fitted at 6971 eV for the portion corresponding to step-wise absorption and $Eu^{2+}$, and at 6978 eV for the peak corresponding to $Eu^{3+}$, and at 6975 eV for the peak corresponding to $Eu_m$. These analyses were carried out using the XAFS data analysis software "Athena" as provided in the following literature:

B. Ravel and M. Newville, J. Synchrotoron Rad. (2005), 12, p. 537-541.

When the areas of the Lorentz function corresponding to $Eu^{2+}$, of the Lorentz function corresponding to $Eu^{3+}$ and of the Gaussian function corresponding $Eu_m$, obtained by modeling the XANES spectrum of the Eu-L3 absorption edge of the β-sialon phosphor and performing the fitting were assigned as $S[Eu^{2+}]$, $S[Eu^{3+}]$ and $S[Eu_m]$, the relative proportions of $S[Eu^{2+}]$, $S[Eu^{3+}]$ and $S[Eu_m]$ were defined as corresponding to the ratios of $Eu^{2+}$, $Eu^{3+}$ and $Eu_m$ present, respectively. $Eu_m/(Eu^{2+}+Eu^{3+}+Eu_m)$ and $Eu^{2+}/(Eu^{2+}+Eu^{3+})$ obtained from the XANES spectra of Example 1 as shown by FIG. 1 were 0.34 and 0.82, respectively, and $Eu_m/(Eu^{2+}+Eu^{3+}+Eu_m)$ and $Eu^{2+}/(Eu^{2+}+Eu^{3+})$ obtained from FIG. 2 of Comparative Example 1 were 0.05 and 0.86, respectively.

Examples 2 to 4, Comparative Examples 2 and 3

In Examples 2 to 4 and Comparative Example 2, mixed raw material powders were prepared in the first mixing composition as shown in Table 1 using the same raw materials as those of Example 1 and each first firing step was carried out by the same method as that of Example 1, with the exception that the first firing step was carried out at 1900° C. for 4 hours. Since the heated samples were loosely agglomerated, the agglomerates were crushed by a hammer and then pulverized by a supersonic jet pulverizer. The pulverization was carried out at a sample feed rate of 50 g/min and under a pulverizing air pressure of 0.3 MPa. The pulverized powders were completely passed through a sieve having an opening of 45 μm. As shown in Table 1, each of these powders (fired powders) was mixed with the powder having the second mixing composition using the same raw materials as those of Example 1. It should be noted that the first and second mixing compositions were designed such that when combined, the z value in the general formula: $Si_{6-z}Al_zO_zN_{8-z}$ of the β-sialon was 0.1 as calculated from the Si/Al ratio with the exception of europium oxide.

TABLE 1

| | First Mixing Composition (% by mass) | | | | First Fired Powder | Second Mixing Composition (% by mass) | | | |
|---|---|---|---|---|---|---|---|---|---|
| | $Si_3N_4$ | AlN | $Al_2O_3$ | $Eu_2O_3$ | | $Si_3N_4$ | AlN | $Al_2O_3$ | $Eu_2O_3$ |
| Example 1 | 95.43 | 3.04 | 0.74 | 0.79 | 50 | 47.72 | 1.52 | 0.37 | 0.40 |
| Example 2 | 97.85 | 1.45 | — | 0.70 | 50 | 48.93 | 0.73 | — | 0.34 |
| Example 3 | 97.32 | 1.98 | — | 0.70 | 70 | 29.59 | 0.06 | — | 0.35 |
| Example 4 | 98.83 | 0.47 | — | 0.70 | 99 | — | 0.53 | — | 0.47 |
| Comparative Example 1 | — | — | — | — | — | 95.43 | 3.04 | 0.74 | 0.79 |
| Comparative Example 2 | 98.54 | 1.46 | — | — | 50 | 48.58 | 0.72 | — | 0.70 |
| Comparative Example 3 | — | — | — | — | — | 97.85 | 1.45 | — | 0.70 |

Each of the mixed raw material powders prepared in the second mixing compositions of Examples 2 to 4 and Comparative Example 2 was subjected to the heat treatment under the same conditions as those of the second firing step of Example 1 (at 2000° C. for 12 hours and in an pressurized nitrogen atmosphere of 0.8 MPa). Since the heated sample was hard agglomerates, the agglomerates were crushed by a hammer and pulverization was then repeatedly carried out by a roll crusher (MRCA-0, an alumina roll, available from MAKINO Corporation) until the sample was completely passed through a sieve having an opening of 150 μm. The pulverized powder was further pulverized by a supersonic jet mill (a sample feed rate of 50 g/min and a pulverizing air pressure of 0.3 MPa). The pulverized powder was subjected to an annealing treatment and an acid treatment in the same argon atmosphere as in Example 1 to provide a β-sialon phosphor of each of Examples 2 to 4 and Comparative Example 2.

In Comparative Example 3, a mixed raw material powder having the same composition as the first mixing composition of Example 2 was subjected to the heat treatment and pulverization, annealing and acid treatment under the same conditions as those of the second firing step of Example 2 to provide a β-sialon phosphor of Comparative Example 3. It should be noted that the mixing composition of Comparative Example 3 was shown in the column of the second mixing composition of Table 1, as in Comparative Example 1.

The powder X-ray diffraction measurement of each β-sialon phosphor of Examples 2 to 4 and Comparative Examples 2 and 3 demonstrated that the crystal phase present in each phosphor was a β-sialon single phase. Table 2 shows the z value calculated from the Si, Al and Eu contents and the Si/Al ratio of each phosphor, the fluorescence peak intensity (a relative value when the value of Comparative Example 2 is defined as 100) and peak wavelength when excited by light with a wavelength of 455 nm, and $Eu_m/(Eu^{2+}+Eu^{3+}+Eu_m)$ and $Eu^{2+}/(Eu^{2+}+Eu^{3+})$ obtained by the XAFS measurement.

TABLE 2

| | Composition (% by mass) | | | z value | Fluorescence Measurement | | $Eu_m/(Eu^{2+} + Eu^{3+} + Eu_m)$ | $Eu^{2+}/(Eu^{2+} + Eu^{3+})$ |
|---|---|---|---|---|---|---|---|---|
| | Si | Al | Eu | | Peak intensity | Peak Wavelength (nm) | | |
| Example 1 | 57.7 | 2.29 | 0.62 | 0.24 | 112 | 542 | 0.34 | 0.82 |
| Example 2 | 59.2 | 0.96 | 0.39 | 0.1 | 105 | 535 | 0.15 | 0.77 |
| Example 3 | 58.5 | 1.09 | 0.41 | 0.11 | 112 | 536 | 0.26 | 0.88 |
| Example 4 | 59.1 | 0.92 | 0.43 | 0.1 | 108 | 535 | 0.18 | 0.82 |
| Comparative Example 1 | 57.3 | 2.23 | 0.56 | 0.23 | 100 | 542 | 0.05 | 0.86 |
| Comparative Example 2 | 58.5 | 1.02 | 0.36 | 0.11 | 92 | 536 | 0.43 | 0.75 |
| Comparative Example 3 | 59.1 | 1.02 | 0.42 | 0.11 | 100 | 535 | 0.08 | 0.68 |

Based on calibration, the phosphors of Examples were found to be β-sialon phosphors having higher luminance than those of Comparative Examples.

INDUSTRIAL APPLICABILITY

The β-sialon phosphor of the present invention can be suitably used as a phosphor for white LEDs using a blue light or ultraviolet light as a light source, because the phosphor is excited by a wide range of wavelengths from ultraviolet light to blue light and exhibits green light emission with high luminance.

What is claimed is:

1. A β-sialon phosphor having a β-sialon as a host crystal and containing Europium (Eu) as a luminescent center, wherein the Eu is present in the β-sialon phosphor in $Eu^{2+}$, $Eu^{3+}$ and $Eu_m$ chemical states, the chemical states are obtained by XANES spectra a ratio of the chemical states of Eu present in the β-sialon phosphor satisfies the relationships: $0.1 < Eu_m/(Eu^{2+}+Eu^{3+}+Eu_m) < 0.4$ and $Eu^{2+}/(Eu^{2+}+Eu^{3+}) > 0.7$ where $Eu_m$ is an intermediate state having a valency between +2 and +3.

2. The β-sialon phosphor according to claim 1, wherein the β-sialon as a host crystal is represented by the general formula: $Si_{6-z}Al_zO_zN_{8-z}$ in which the z value is 0.005 or more and 1 or less.

3. The β-sialon phosphor according to claim 1, wherein the β-sialon phosphor has an Eu content of 0.1 to 2% by mass.

4. A method for producing the β-sialon phosphor according to claim 1, comprising:
a first firing step of firing a mixed powder containing at least silicon nitride, aluminum nitride and an Eu compound in a nitrogen atmosphere at a temperature of 1550 to 2100° C. to provide a fired powder;
a second firing step of adding to the fired powder one or more powders selected from silicon nitride, silicon oxide, aluminum nitride, aluminum oxide and europium oxide and firing a resulting powder mixture in a nitrogen atmosphere at a second firing temperature of 1900 to 2100° C. to provide a fired product;
an annealing step of heating the fired product in a non-oxidizing atmosphere other than pure nitrogen at a temperature less than or equal to the second firing temperature to provide an annealed powder; and
an acid-treating step of treating the annealed powder with an acid.

5. A light emitting member comprising a light emitting element; at least one β-sialon phosphor that absorbs light emitted from the light emitting element and emits light having a longer wavelength than light emitted from the light emitting element; and a sealing material containing the at least one β-sialon phosphor, wherein the at least one β-sialon phosphor is the β-sialon phosphor according to claim 1.

6. A light-emitting device using the light emitting member according to claim 5.

* * * * *